United States Patent
Onodera

[19]

[11] Patent Number: 5,839,186
[45] Date of Patent: Nov. 24, 1998

[54] COMPONENT ATTRACTED STATE DETECTING SYSTEM FOR COMPONENT MOUNTING MACHINE

[75] Inventor: Hitoshi Onodera, Iwata, Japan

[73] Assignee: Yamaha Hatsudoki Kabushiki Kaisha, Iwata, Japan

[21] Appl. No.: 480,153

[22] Filed: Jun. 7, 1995

Related U.S. Application Data

[62] Division of Ser. No. 148,832, Nov. 5, 1993, abandoned.

[30] Foreign Application Priority Data

Nov. 5, 1992 [JP] Japan .................................. 4-296124

[51] Int. Cl.⁶ .................................................. B23P 21/00
[52] U.S. Cl. ............................................................. 29/720
[58] Field of Search ............................. 29/720, 740, 741, 29/742, 721; 356/375

[56] References Cited

U.S. PATENT DOCUMENTS

| | | |
|---|---|---|
| 4,706,379 | 11/1987 | Seno et al. . |
| 4,793,707 | 12/1988 | Hata et al. . |
| 4,797,994 | 1/1989 | Michaud et al. . |
| 5,086,559 | 2/1992 | Akatsuchi . |
| 5,216,804 | 6/1993 | Rosier et al. . |

FOREIGN PATENT DOCUMENTS

| | | |
|---|---|---|
| 0471272 | 2/1992 | European Pat. Off. . |
| 236598 | 2/1990 | Japan . |
| 3110896 | 5/1991 | Japan . |
| 3218697 | 9/1991 | Japan . |
| 513991 | 1/1993 | Japan . |
| 6152194 | 5/1994 | Japan . |
| 9214988 | 9/1992 | WIPO . |

Primary Examiner—Carl E. Hall
Assistant Examiner—Christopher Goins
Attorney, Agent, or Firm—Knobbe, Martens, Olsen & Bear LLP

[57] ABSTRACT

A method and apparatus of mounting components and recognizing two different types of components, one by a photographic recognition practice and the other by an optical recognition practice. At least two pick-up devices are carried by a mounting head and a light source and background device is moveable supported by the mounting head into a first position wherein a photographic recognition method can be practiced on a component mounted on one of the pick-up devices, a second position wherein one or both of the pick-up devices may hold components for recognition by the optical device and a third position where a camera carried by the mounting head can be employed for recognizing a substrate. The control routines for each type of sensing operation are disclosed.

10 Claims, 10 Drawing Sheets

COMPONENT ATTRACTED STATE DETECTING SYSTEM FOR COMPONENT MOUNTING MACHINE

This application is a divisional of U.S. patent application Ser. No. 08/148,832, filed Nov. 5, 1993 abandoned.

BACKGROUND OF THE INVENTION

This invention relates to a component attracting state detecting system for a component mounting machine and more particularly to an improved apparatus for handling a wide variety of components, detecting their orientation, and mounting them as well as recognizing the substrate upon which they are mounted.

A wide variety of apparatus have been proposed for picking up small discreet components at a pick up station and mounting them on a substrate at an accurate location. Such apparatus are used, for example, in mounting such small components as integrated circuits, resistors, capacitors and like objects on a printed circuit board. The components are normally presented at the pick up stations in feed tapes which are incrementally advanced and from which pick up heads select the components and move them to their mounting position.

By the very nature of this type of apparatus, the component pick-up device is not able to pick up the component at an exact location because some latitude must be permitted in cavity in the tape so as to permit the component to be easily withdrawn. Therefore, it has been the practice to provide an arrangement for detecting the condition of the component picked-up by the pick-up device so as to make corrections in the mounting location to correspond for the offset of the pick up. For example, if a component is picked up and translated in an X—X and Y—Y direction for mounting, the components offsetting of the pick up location relative to the pick-up device in the X—X and Y—Y axes can affect where the component should be mounted. Said another way, the pick up device must be positioned somewhat differently to correspond to these offsets. In addition, there may be rotational offset of the component relative to the axis of the pick-up device and this also must be compensated for.

A wide variety of recognition apparatus have been proposed for determining the corrective factors from the offset of the component relative to the pick-up device. An optical method and apparatus for performing such a recognition and measurement is disclosed in the co-pending United States Patent application of Hiroshi Sakurai et al entitled "Method For Mounting Components And An Apparatus Therefor", Ser. No. 08/073,741, filed Jun. 8, 1993 and assigned to the Assignee hereof. That apparatus employs a laser light source which emits a plurality of parallel light rays across an area into which the component is positioned. The component then casts a shadow on a photo sensitive detector such as a capacitor coupled device(C.C.D.). The component is rotated and from the rotational measurements, the corrective factors can be readily determined in the method as described in that application, the disclosure of which is incorporated herein by reference.

That method and apparatus, however, is primarily applicable to components having regular shapes such as rectangular shapes and components which do not have irregularities such as are presented by mounting pins, extending lead wires or the like.

Another type of detecting device employs a photographic method wherein the underside of the component (the side to be mounted on the substrate) is photographically recognized and from the photographic recognition, not only the type of component but misalignments in its pick up location can also be determined.

Since the aforenoted measurements are normally performed by different types of apparatus, many mounting devices are not capable of mounting both types of components or if they are, they must provide separate mounting heads and sensing devices for each type of component.

It is, therefore, a principal object to this invention to provide an improved mounting and orientation determination apparatus that is useable with a wide variety of types of components.

It is a further object to this invention to provide a mounting and orientation handling device that is capable of handling different components and recognizing the components by two different types of recognition apparatus while using a single mounting head.

With the photographic recognition method it is desirable to provide not only a light source so that the component will be adequately illuminated for photographic purposes, but also a background which will black out or obscure the pick-up device and other components from the field of view of the camera. The previous types of devices proposed for this purpose have, however, limited the applicability of device from handling a wide variety of components and also have been somewhat cumbersome and complicated.

It is, therefore, a still further object to this invention to provide an improved combined light source, diffuser plate and background for use in a component handling device which can be moved to a position behind the component when photographed by a camera and may be moved out of the way when not required.

As has been noted, it is desirable if a single mounting head is capable of handling components which can be recognized by either of the aforenoted methods. In fact, it is desirable to also provide an arrangement wherein some of the recognition methods may be performed on plural components at the same time and in a common sensing station. However, if this is done with the optical recognition method, which lends itself to such multiple sensing, then it is difficult to provide the light source and background required for the photographic recognition method.

It is, therefore, a still further object to this invention to provide an improved mounting apparatus for components employing plurality of pick devices and which will accommodate either type of recognition method.

It is a further object to this invention to provide an improved component mounting device that employs plural pick-up devices and which can incorporate a light and background arrangement for assisting in photographic recognition without interfering other methods of recognition or the picking up and sensing of plural components by these other methods.

As should be readily apparent from the foregoing description, the use of a moveable light source and background device on a mounting head has a number of advantages for recognition of components picked up by the pick-up devices carried by the head. However, it is also desirable, at times, to have a sensing device on the mounting head which can sense the substrate and recognize it onto which the components are being mounted. Where the mounting head includes a light source, it is desirable if that light source can also be used in the substrate recognition system.

It is, therefore, a still further object to this invention to provide an improved apparatus have a mounting head for handling components to be positioned on a substrate, a photo assist device for assisting in photographic recognition of those articles and also a photograph recognition device carried by the mounting head for recognizing the substrate and which can use the same photo assist device in this operation.

SUMMARY OF THE INVENTION

A first feature of this invention is adapted to be embodied in a component mounting device for picking up a component and mounting the component in precise locations on a substrate. The apparatus comprises a pick-up device for picking and depositing components and means which support the pick-up device for movement between a pick up position for picking up any of a plurality of components and a deposit position for depositing the components. A first recognition device is co-operable with the pick-up device and a first type of component carried thereby for providing data to detect the orientation of the first type of component as held by the pick-up device in a first manner. A second recognition device is co-operable with the pick-up device and another type of component carried thereby to detect the orientation of the other type of component as held by the pick-up device in a second manner which is different from the first recognition manner.

Another feature of the invention is adapted to be embodied in a component handling device for photographic recognition of a component comprised of a head and a combined light source and diffuser plate for emitting and diffusing light toward a camera. Means support the combined light source and diffuser plate for movement relative to the head between an operative position in confronting relation to the camera and a retracted position.

DETAILED DESCRIPTION OF THE PREFERRED EMBODIMENT OF THE INVENTION

Figure 1:
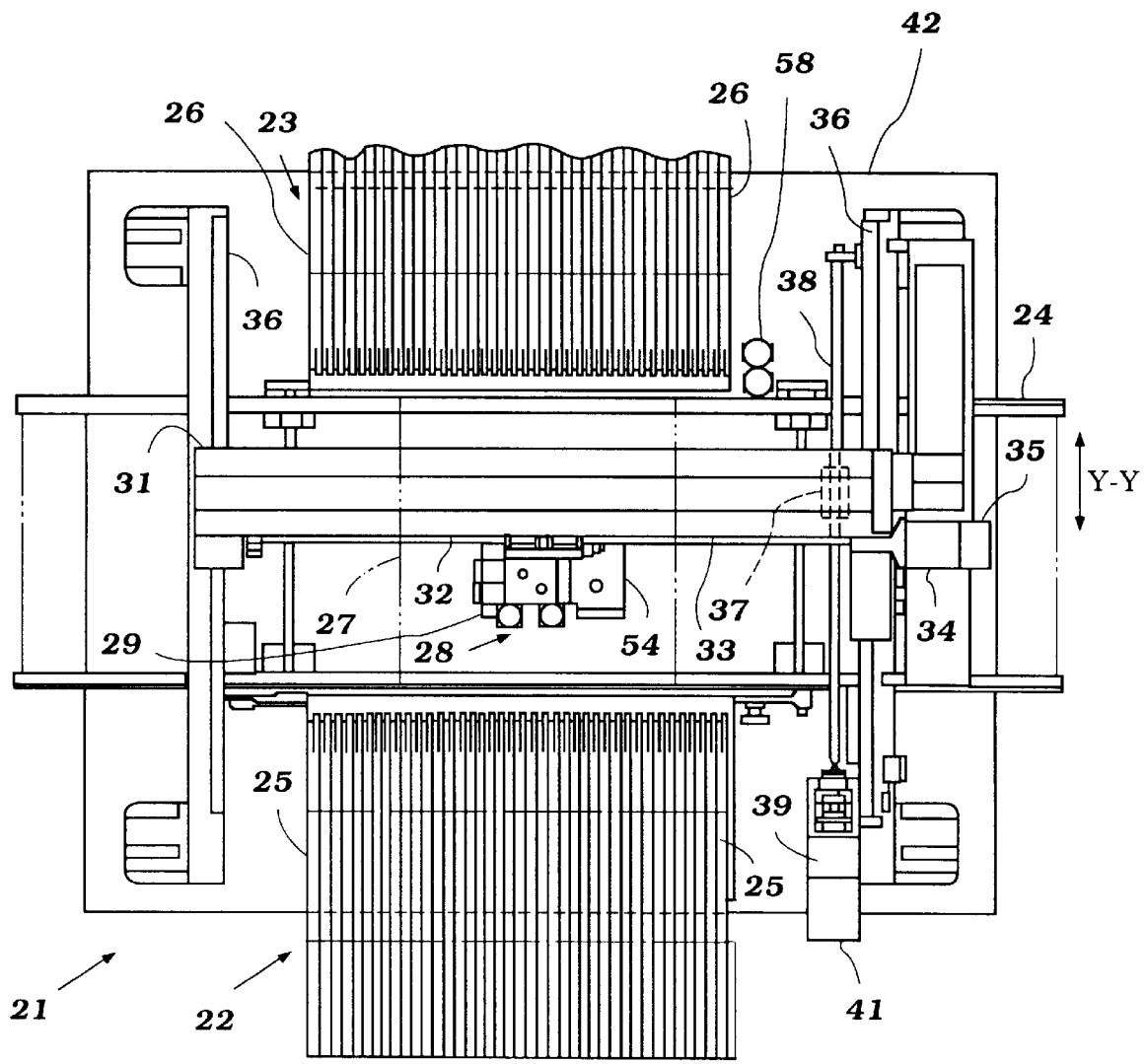
FIG. 1 is a top plane view of a component mounting and detecting apparatus constructed in accordance with an embodiment of the invention.
Figure 2:
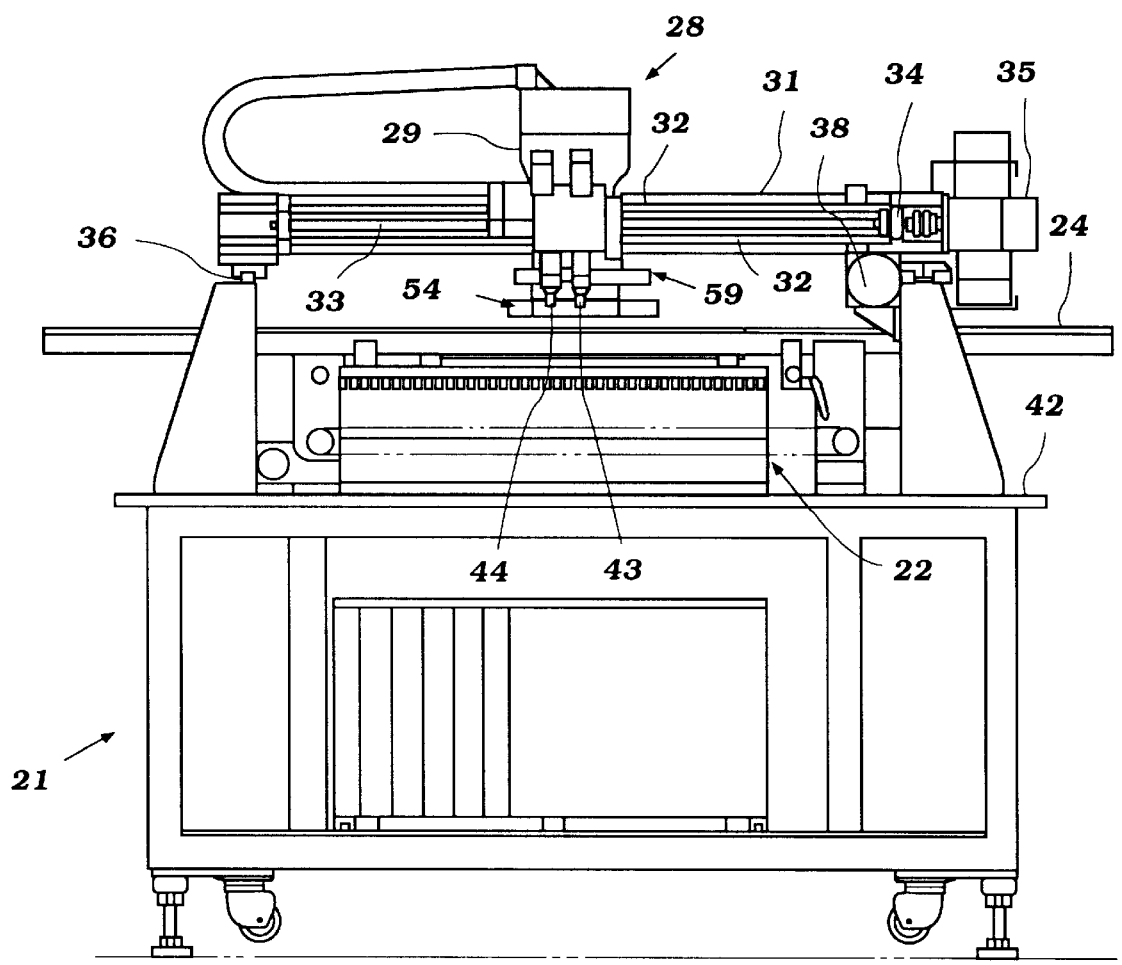
FIG. 2 is a front elevational view thereof.

Referring now in detail to the drawings and initially to FIGS. 1 and 2, a component mounting apparatus constructed and operated in accordance with a preferred embodiment of the invention is identified generally by the reference numeral 21. The apparatus 21 is adapted to mount small components such as integrated circuits, resistors, capacitors or the like which are supplied at respective delivery stations 22 and 23 disposed on opposite sides of a conveyor assembly 24. The delivery sections 22 and 23 comprise a plurality of individual feeders 25 and 26, respectively, of the type each of which comprises a roll of tape having pockets in which the components to be mounted are contained. These tapes are advanced by a ratchet mechanism under a control as is well known.

The conveyor 24 selectively presents substrates, indicated at 27, to a mounting area positioned between the delivery sections 22 and 23. A pick-up and recognition device, indicated generally by the reference numeral 28 is mounted for movement in an X—X and Y—Y direction in a manner which will be described so as to selectively pick up components from the feeders 25 and 26 and position them on the substrates 27 at the desired and pre-programmed location. In addition, the pick-up and recognition station 28 cooperates so as to provide an indication of the orientation of the components picked up thereby so as to adjust for their mounting position, as will be described.

The pick-up and recognition station 28 includes a mounting head 29 which is mounted for movement along a carriage 31 by means of guide rails 32 and a driving feed screw 33. The feed screw 33 has a ball nut connection with the mounting head 29 so that upon rotation of the feed screw 33, the mounting head 29 will move in the X—X axis.

An X—X axis drive motor 34 is mounted at one end of the carriage 31 and is coupled to the feed screw 33 for driving it in clockwise or counter-clockwise directions so as to appropriate position the mounting head 29. An encoder 35 is coupled to the electric motor 34 and provides a positional X—X signal to the control apparatus as shown in the block diagram of FIG. 10.

The carriage 31 is mounted for movement in the Y—Y direction on a pair of guide rails 36 which are disposed at opposite sides of the area where the substrates or printed circuit boards 27 are disposed and outwardly of the ends of the feeder sections 22 and 23. A suitable way construction permits this movements along the guide rails 36.

Figure 10:
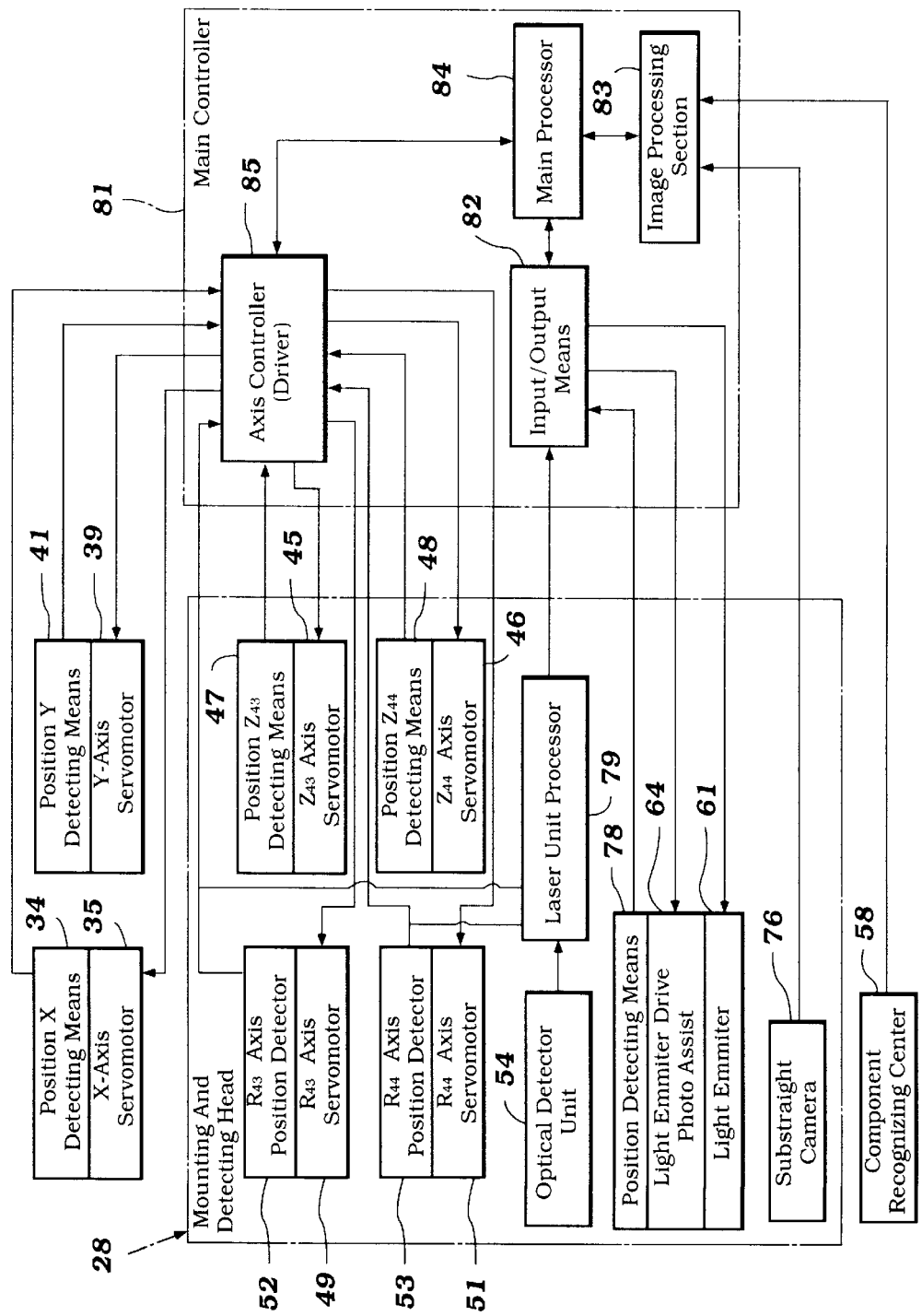
FIG. 10 is a block diagram showing the interrelationship of the components of the system.

The carriage 31 is provided with a recirculating ball nut 37 which is engaged with a feed screw 38 that is journalled on one of the guide rails 36. This feed screw 38 is driven by a reversible electric motor 39 so as to move the carriage 31 and mounting head assembly 28 in the Y—Y direction. An encoder 41 is coupled to the motor 39 and as shown in FIG. 10, provides an output signal indicative of the Y—Y position of the mounting head assembly 28.

The entire assembly as thus far described may be mounted conveniently on a table 42 so that the apparatus can be moved from location to location, but also can be retained in position.

Figure 3:
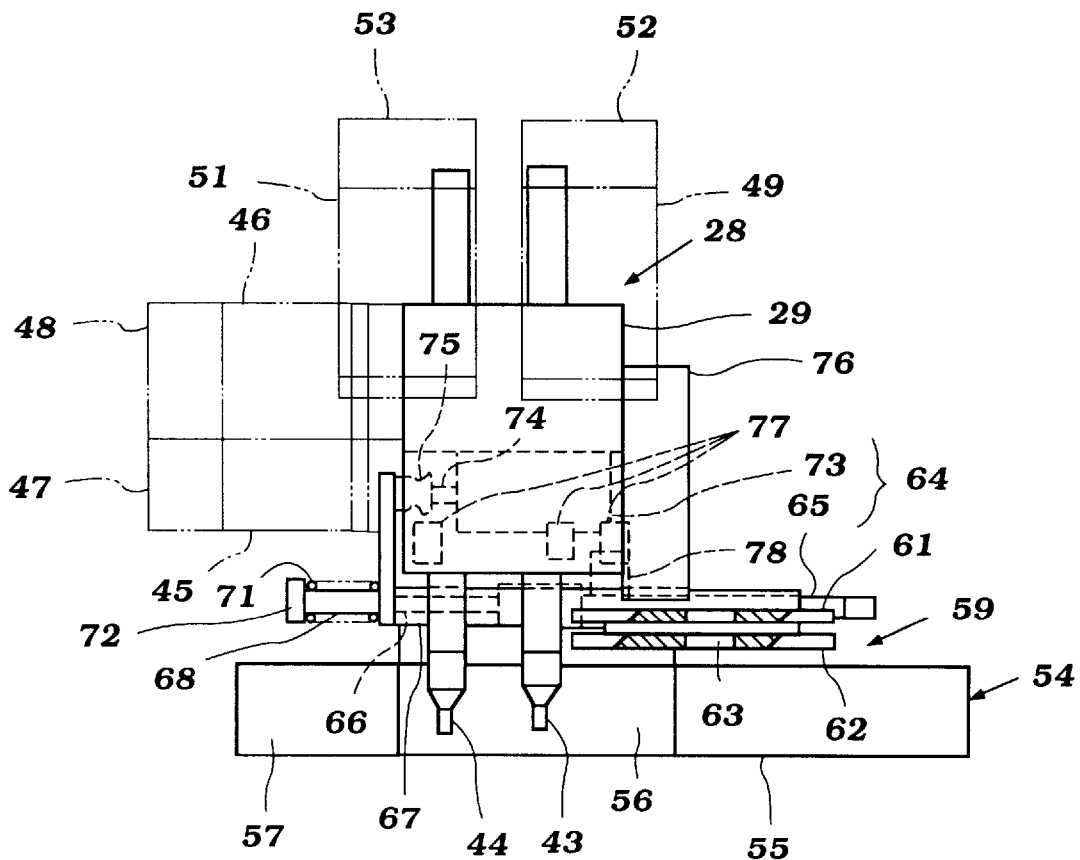
FIG. 3 is an enlarged front elevational view of the mounting nozzles and detecting head in a first position.

The construction of the gripping and detecting section 28 will now be made by reference to FIGS. 3 through 9. Referring first to FIG. 3, it should be noted that the mounting head 29 carries, in this embodiment, two pick-up nozzles indicated by the reference numerals 43 and 44. The pick-up nozzles 43 and 44 are of the vacuum type, but it should be readily apparent to those skilled in the art how the invention can be employed with other types of pick-up nozzles. Reference is made to the co-pending application filed in the name of Hiroshi Sakurai etal entitled "Method For Mounting Components And An Apparatus Therefor", Ser. No. 08/086, 512, filed Jul. 1, 1993, and assigned to the Assignee hereof for a more detailed description of how the plural pick-up nozzles may be mounted on a single mounting head. The disclosure of that application is incorporated herein by reference.

Briefly summarized, each of the pick-up nozzles 43 and 44 is mounted for movement in a vertical direction along a Z—Z plane by the mounting head 29 and is driven for movement in such direction by a respective Z—Z axis servo motor 45 or 46. Encoders 47 and 48 are coupled to the drive motors 45 and 46 so as to provide an output signal indicative of the ZZ position of the respective nozzles 43 and 44 as shown in FIG. 10.

In addition, the nozzles 43 and 44 are also supported for rotation about vertical R axes in a manner described in the aforenoted co-pending application Ser. No. 08/086,512. Rotational movement about these axes is obtained by R axis servo motors 49 and 51 which are coupled to the nozzles 43 and 44, respectively, for effecting rotary movement. Encoders 52 and 53 are connected to the motors 49 and 51, respectively, and provide output signals indicative of the angular position about the rotation R axes. Again, the relationship of these components is shown in FIG. 10.

In accordance with an important feature of the invention, the station 28 also serves for providing detection of the position of the components which are picked up by the pick-up nozzles 43 and 44 so as to make correction factors for misalignment of their pick up from the ideal position so that when they are; positioned on the substrate 27 they will be positioned in an accurate location.

In accordance with this invention, two different forms of detectors are employed depending upon the type of article which will be picked up by the nozzles 43 and 44. If the article to be picked up has a generally regular rectangular configuration, such as many chips and other components, then the orientation will be detected by a detector, indicated generally by the reference numeral 54, which is described as being of the optical type. This is the type of detector which is described in detail in aforenoted co-pending application Ser. Nos. 73,741, and 86,512, the disclosures which have already been incorporated herein by reference.

Figure 6:
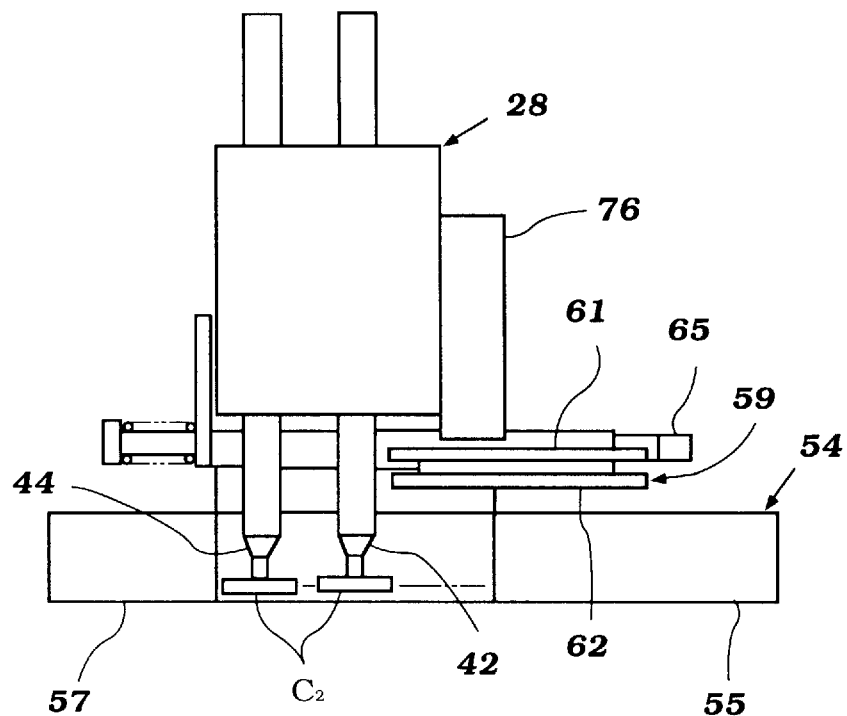
FIG. 6 is an enlarged view, in part similar to FIGS. 3 and 4, and shows the apparatus when a pair of components are being detected in the optical detecting section.
Figure 7:
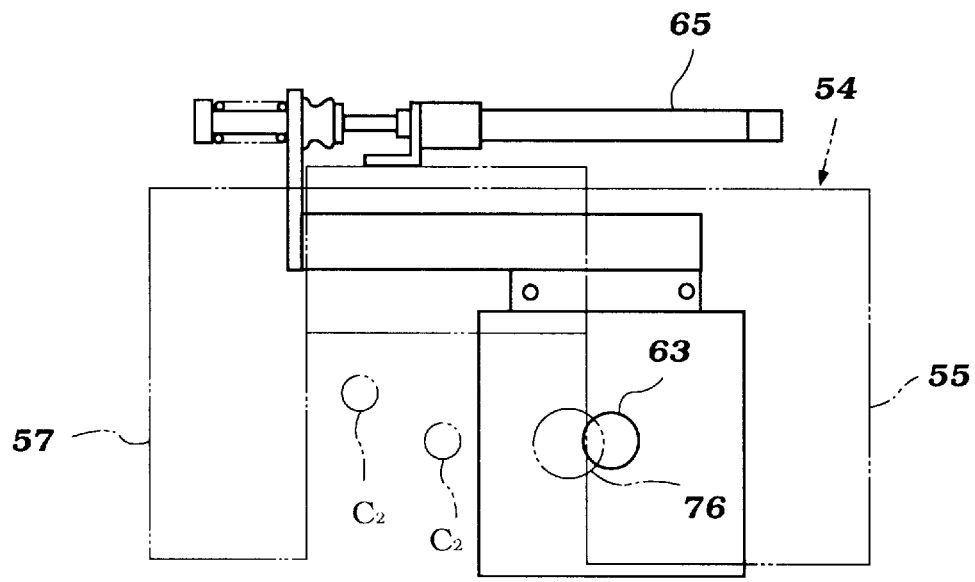
FIG. 7 is a top plan view of the apparatus as shown in FIG. 6.

Briefly, this detector 54 includes a laser light source 55 that emits generally straight light rays across a gap 56 in which the pick-up nozzles 43 and 44 may be positioned, as will be described, and cast shadows on a receptor 57 of the capicator coupled type (C.C.D.) type. In order to permit simultaneous recognition and measurement of components carried by both of the pick-up nozzles 43 and 44 at the same time, these nozzles are staggered relative to the gap 56 as best seen in FIGS. 6 and 7 and this method of simultaneous measurement is as described in any of the routines of application Ser. No. 86,512.

In addition to the optical detecting method described in the aforenoted co-pending applications, at least one of the pick-up nozzles 43 and 44 and in this case the pick-up nozzle 43, is adapted to present components to a further type of detector, a photographic detector, indicated at the reference numeral 58 in FIG. 1 and which is positioned at one side of the conveyor 24. When this detector 58 is employed, the head assembly 28 is moved into registry with it so that the component carried by the nozzle 43 can be read, in a manner which will be described.

To facilitate this reading, there is provided an optical assist device, indicated generally by the reference numeral 59 which is mounted on the head 29 in a manner for movement in a direction parallel to the upper surface of the optical detector 54. This optical assist device 59 is comprised of a light source 61 of a suitable type such as an array of light emitting diodes and a lower diffuser section 62 which also forms a background for photography which will transmit and diffuse the light. The diffuser section 62 may be comprised of a milk white acrylic plate or the like so that light from the emitter 61 will be diffused. The light source 61 and diffuser plate 62 are provided with an aperture 63 which, when brought in registry with the nozzle 43, will act as a background for photographing of a component carried by this nozzle 43 by the photographic detection section 58 for recognition and orientation calculation purposes.

As has been noted, the photo assist section 59 is supported for transverse movement and this transverse movement is accomplished by means of a driving mechanism, indicated generally by the reference numeral 64 and which is comprised of a first hydraulic or pneumatic cylinder 65 that has an actuating rod 66 that passes through a mounting member 67 which is affixed to and carries the photographic assist mechanism 59 including the light source 61 and diffuser plate 62. The piston rod 66 has a portion 68 that extends through an abutment member 69 fixed to one end of the mounting member 67 and which is urged normally into engagement with an end of the rod 66 by a coil compression spring 71 loaded between the abutment member 69 and an enlarged end 72 of the piston rod 66. Hence, when the cylinder 65 is actuated to move the piston rod 66 to the left as shown in the figures, the photo assist device 59 will be moved in the same direction.

The actuating mechanism 64 further includes a second cylinder assembly 73 that has a piston rod 74 that is connected to an abutment member 75. When the piston rod 74 is extended, the abutment member 75 will contact the abutment member 69 and effect limited movement of the light assist device 59 in a manner as will be described.

The detecting and mounting head 28 also includes a further camera type detector 76 which has its lens disposed above one side of the gap 56 so that when the mounting head 28 is positioned above a substrate or circuit board 27 on the conveyor 24, a portion of it can be optically viewed and photographed. The photo assist device 59 is adapted to assist in this operation in a manner which will become apparent shortly.

FIG. 3 illustrates the pick-up head 28 in a position wherein the nozzles 43 and 44 may either or both be used to pick up components from the feed sections 22 and 23 and to place those components on the substrate or printed circuit board 27. In this position, neither of the fluid motors 65 nor 73 are actuated and the photo assistance device 59 is retracted to an extreme right hand first position as shown in FIG. 3. It should be noted that this device carries three limit stops 77 which indicated each of the three positions of the photo assist device 59 in conjunction with a detector 78 actuated by the limit stops 77.

Figure 4:
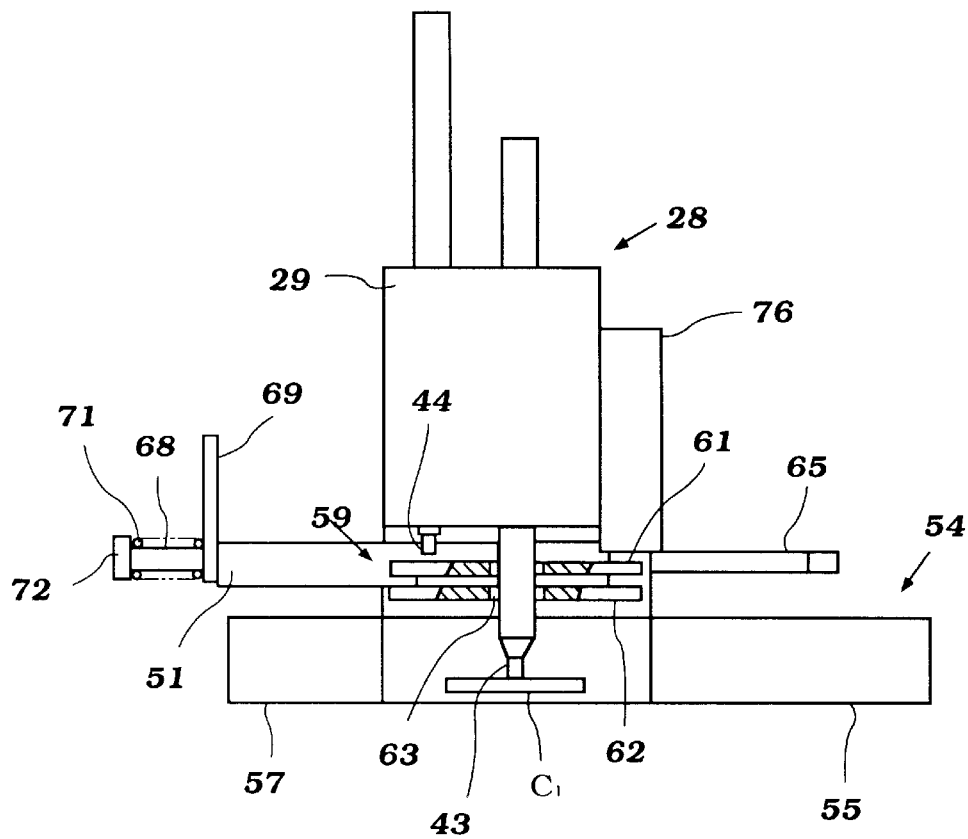
FIG. 4 is an enlarged view, in part similar to FIG. 3, and shows the construction when the photographic recognition technique is being employed.
Figure 5:
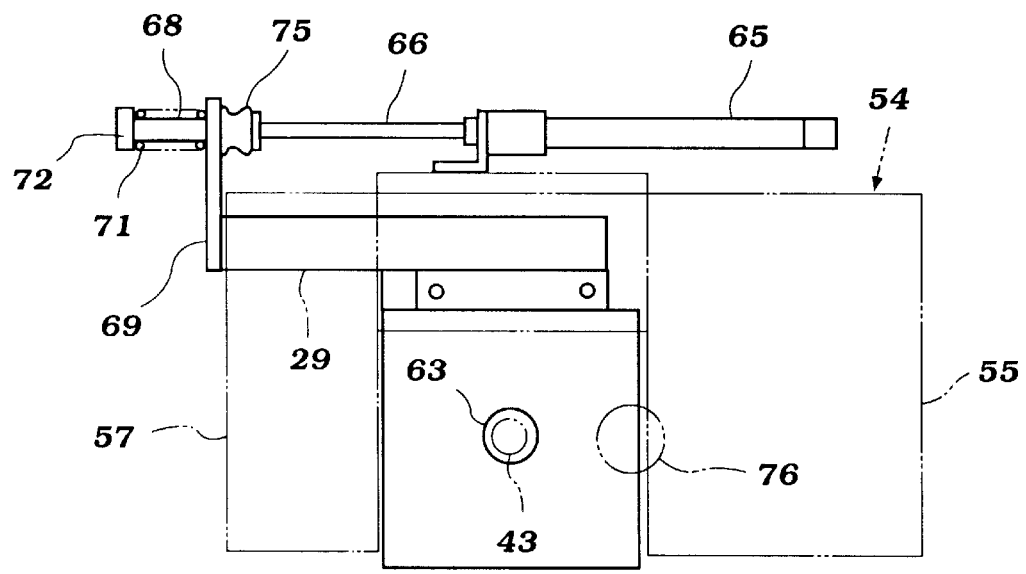
FIG. 5 is a top plan view of the apparatus in the condition as shown in FIG. 4.

FIGS. 4 and 5 show the mechanism in a position wherein the photographic detecting section 58 of the apparatus is employed. In this condition, the nozzle 44 is fully retracted and, before the nozzle 43 is lowered, the fluid motor 65 is actuated so as to move the photo assist device 59 to the position wherein the opening 63 registers with the nozzle 43. The nozzle 43 may then be lowered to a position where it will extend through the opening 63. The light source 61 can then be illuminated and the diffuser 62 will permit the light to pass down sufficiently to photograph a component $C_1$ picked up by the nozzle 43 at the photographic detector section 58.

In this condition, the photographic detector section 58 can compare the image with a memory and determine the actual location which the component $C_1$ has been picked up so that appropriate orientation can be made in a manner which will be described. The type of component $C_1$ that cannot be recognized by the light sensing device 54 is a type of component which may have a number of pins on its lower surface or may have other characteristics that make the light source detection not acceptable.

FIGS. 6 and 7 show the apparatus in a condition corresponding to that of FIG. 3, but in this view there are shown components $C_2$ picked up by each of the nozzles 43 and 44 and positioned in the optical detector section 54 for light detection of the orientation of the component $C_2$ relative to the pick-up nozzles 43 and 44, respectively, in accordance with any of the methods as described in co-pending application Ser. No. 86,512. Since that disclosure has been incorporated herein by reference, the description of performing that detection method will not be repeated.

Figure 8:
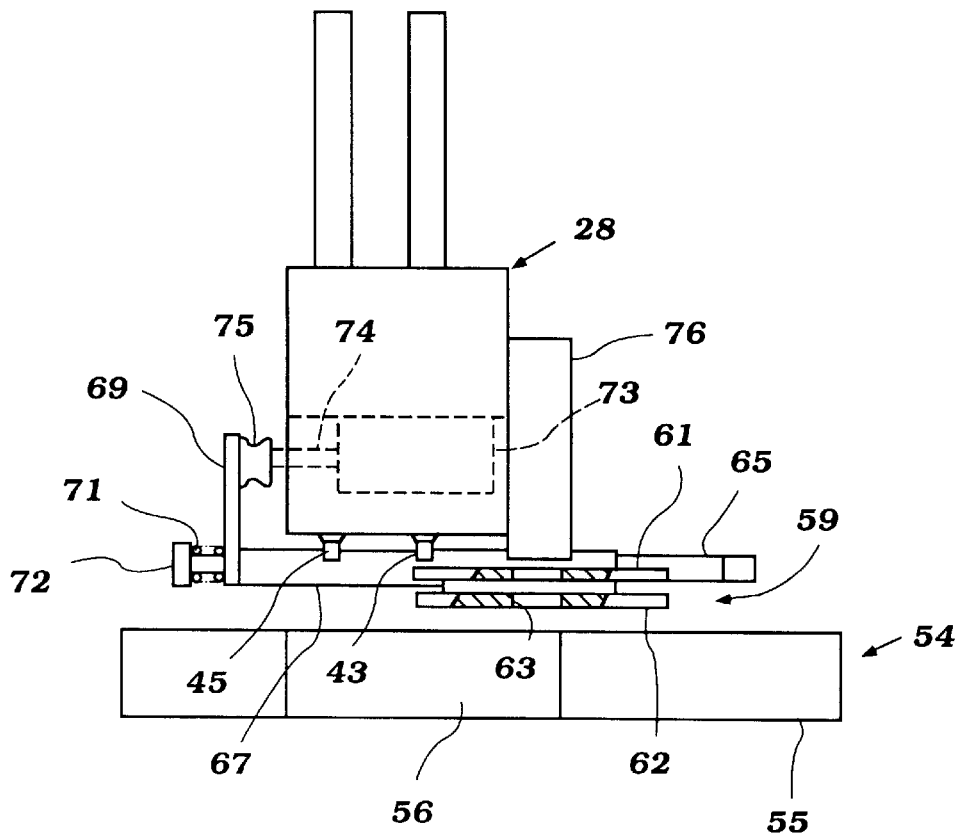
FIG. 8 is an enlarged elevation view, in part similar to FIGS. 3, 4 and 6, and shows the apparatus when the substrate is being photographically scanned.
Figure 9:
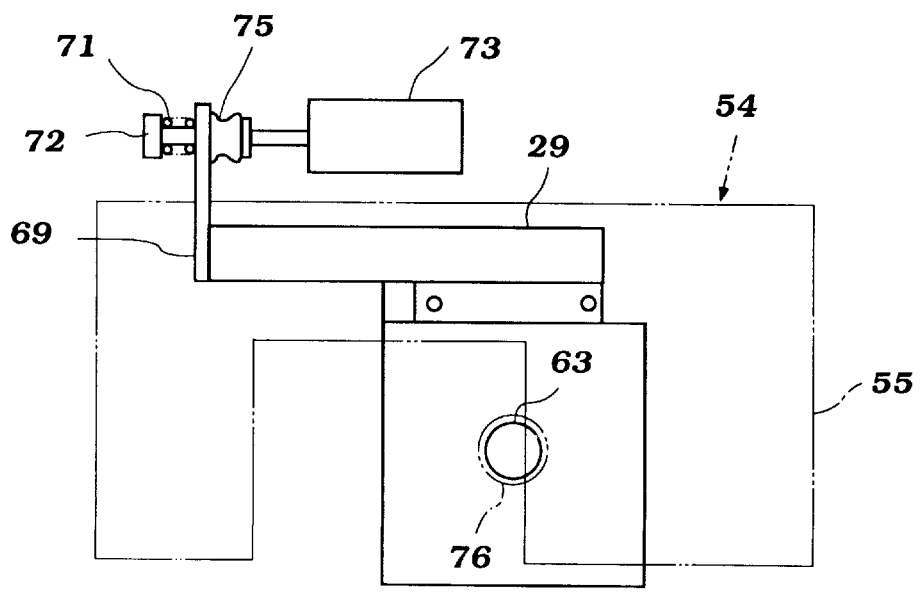
FIG. 9 is a top plan view of the apparatus shown in the condition of FIG. 8.

The remaining possible mode of operation is depicted in FIGS. 8 and 9 and this is the mode when the camera 76 carried by the head assembly 28 is employed for photographing and recognizing a substrate 27 on the conveyor 24. In this condition, the drive cylinder 65 for the photographic assist device 59 is not actuated, but the drive cylinder 73 is. This causes the piston rod 74 to extend and engage the abutment 75 and abutment member 69 and urge them to the left so as to compress the coil compression spring 71. This causes the carrier 67, light source 61 and diffuser plate 52 to be moved to their third position wherein the aperture 63 is aligned with the recess 56 in the optical sensor section 59. Hence, the field of view of the camera 76 is the unobstructed and the substrate 27 can easily be photographed. The light from the light source 61 is illuminated at that time and diffused by the diffuser plate 62 so as to assist in the photographic recognition of the substrate 27.

The mode of operation of the total apparatus will now be described and initially reference will be made to FIG. 10 which shows the interrelationship of the various components thus far described and additional components which will now be described.

The optical detector unit 54 outputs its information to a laser unit processor 79 which is mounted on the mounting and detecting head 28 and outputs its signals to a main controller,indicated. in block form by the reference numeral 81. This signal is received by an input/output means 82 of the main controller. The output of the position detecting means 78 which detects, as aforenoted, the position of the optical assistance unit 59 is also outputted to the input/output means.

The drive assembly 64 of the photo assisting means 59 is controlled by the output of the input/output means 82 as is the operation of the light emitter 61 thereof.

The main controller 68 also has an image processing section 83 which receives signals from both the substrate camera 76 and the component recognizing camera 58 and contains a memory that will provide recognition of both the substrate and the component picked up by the pick-up nozzle 43 and provides information to a main processor 84 which, in turn, calculates the corrective factors to be applied. The main processor also is interrelated to an axis controlled driver stage 85 which receives signals from the various position detectors such as the R axis position detectors 52 and 53 of the pick-up nozzles 43 and 44 respectively and the Z axis position detectors 47 and 48 associated with the nozzles 43 and 44. In addition, the X and Y axis position detectors 34 and 41 output their signals to the axis driver controller 85 which then sends signals to the respective servo motors, 35, 39, 49, 51, 45 and 46 for appropriately positioning the components in accordance with the type of control routine which will be accomplished. A portion of these control routines will now be described by reference to FIGS. 11 through 13.

In describing each of the sequences of operation, the actual way in which the main controller 81 operates to control the axis driver controller 85 and the X axis servo motor 35 and Y axis servo motor 39 to move the pick-up head 28 into registry with the appropriate feeder 25 or 26 in the feeder stations 22 and 23 may be of any conventional system. As is noted in the aforenoted co-pending applications, certain of the steps which will be described can be performed while the mounting head 28 is moving either the pick up position and/or to the position where the component will be mounted. Said another way, the only portion of the control routine which will be described is the control routine wherein the component or components are picked up, recognized, the correction calculation made and the mounting calculations made. Those skilled in the art can readily understand how these procedures can be interfaced with the procedure for moving the head assembly 28 to the pick up and mounting locations and to the external photographic recognition station 58.

Figure 11:
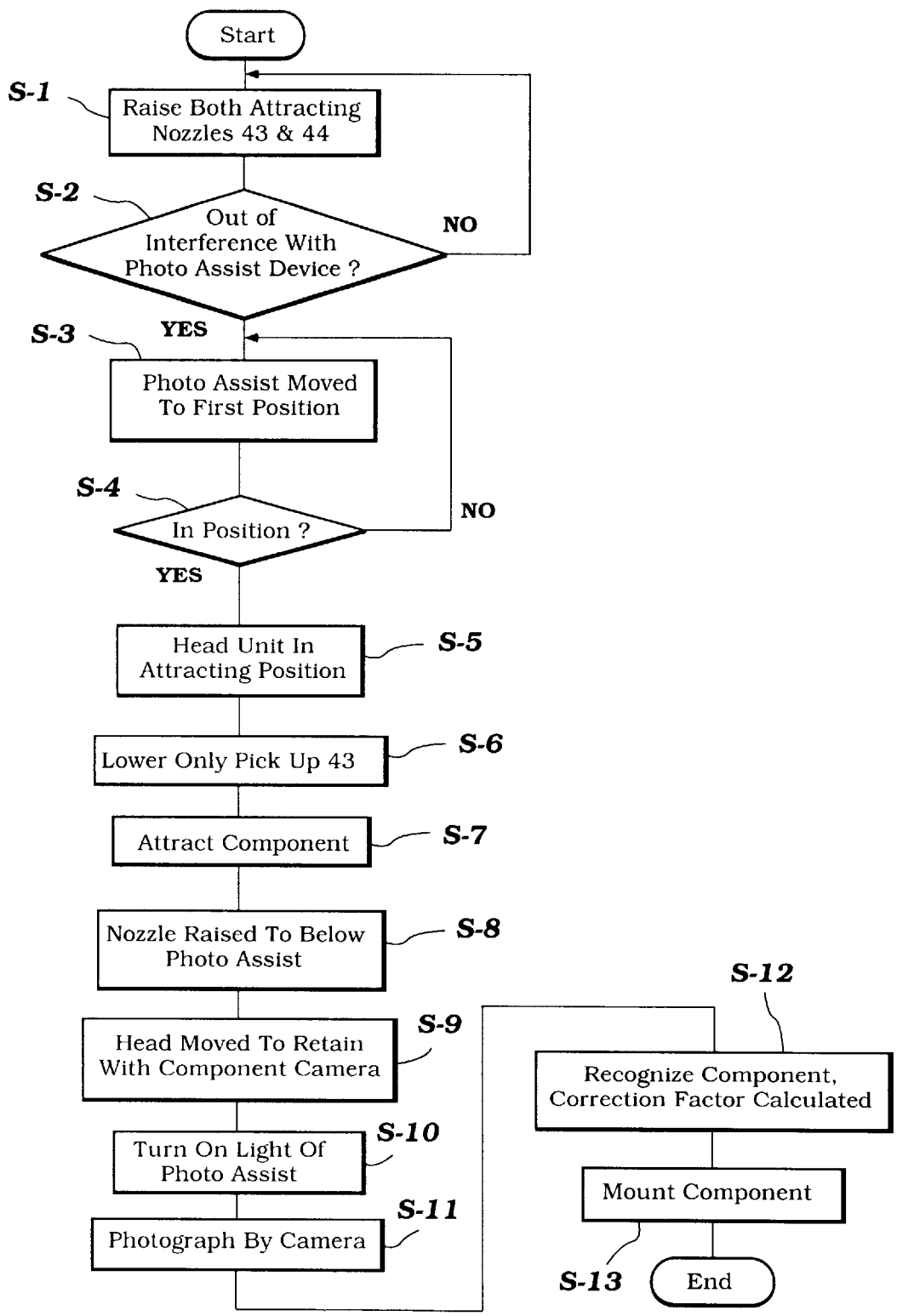
FIG. 11 is a block diagram showing the control routine when a component is being attracted and mounted using the photographic recognition technique.

Referring now to the embodiment of FIG. 11, this is the control routine which is employed when a component such as the component $C_1$ which is recognized by the camera 58 is picked up and mounted. Hence, the block diagram of FIG. 11 will relate to FIGS. 4 and 5 of the drawings which show this type of recognition situation.

After the program is stated, the axis driver control 85 energizes both Z axis servo motors 45 and 46 to raise both the nozzles 43 and 44 to a fully retracted position where they will be clear of the photo assist device 59. This is the position shown in FIG. 8.

The program moves to the step S-2 to determine if these nozzles have then been out of interference range with the photo assist device 59. This may be either be done by measuring their height position from the Z axis position detectors 47 and 52 or by means of some form of limit switch or interference sensor. If the device is not out of the interference range, the program moves back to the step S-1 so as to continue the elevation.

If, however, at the step S-2 it has been determined both of the nozzles 43 and 44 are out of interference position with the photo assist device 59, the program at the step S-3 operates to actuate the cylinder 65 so as to move the photo assist device 59 to the position shown in FIGS. 4 and 5 wherein the opening 63 registers with the nozzle 43.

The program then moves to the step S-4 to determine if the photo assist device 59 is in this first position. If it is not, the program repeats.

If, however, it is determined at the step S-4 that the photo assist device 59 is in its first position, then the program moves to the step S-5 so as to move the head unit 28 to the attracting position in registry with the appropriate feeder section 25 or 26 to pick up the appropriate component. The program then moves to the step S-6 so as to lower only the pick up nozzle 43 toward the component to be picked up. This is done by actuating the Z axis servo motor 45.

The program then moves to the step S-7 wherein the correct component $C_1$ is attracted by exerting vacuum on the nozzle 43. The program then moves to the step S-8 so as to raise the pick-up nozzle 43 to a position wherein the nozzle 43 (or component $C_1$) will be positioned below the photo assist device 59.

The program then moves to the step S-9 so as to move the mounting head assembly 28 to a position over the component camera 58 at one side of the conveyor 24.

Once the component is disposed above the component camera 58, the program moves to the step S-10 so as to illuminate the LED's 61 of the photo assist device 59 and then actuate the camera 58 at the step S-11 so as to take the picture.

This picture is then transmitted to the image processing section 83 at the step S-12 and the shape of the component as photographed is compared with the photographs in the memory so as to determine that the correct component has been picked up and, at the same time, the deviations in the position of the component relative to the pick-up nozzle 43 both around the rotational axis R and in the X and Y planes are also determined.

These establish correction factors that are then programmed into the main processor 84 so as to move the head 28 to the appropriate mounting position at the step S-13 and mount the component at this time.

Figure 12:
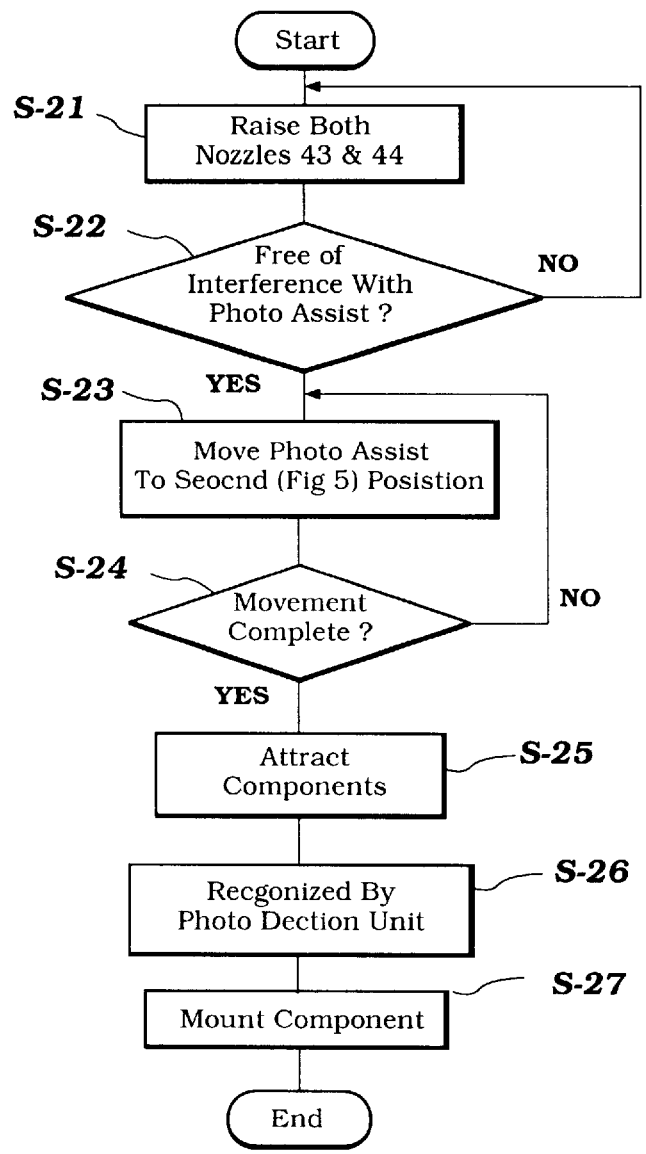
FIG. 12 is a block diagram showing the control routine when a component is being mounted using the optical detecting technique.

Referring now to the routine of FIG. 12, this shows the control routine where one or more components that can be recognized in the optical detector unit 54 are picked up by the nozzles 43 and/or 44. This configuration is depicted in FIGS. 6 and 7 wherein components $C_2$ are picked up by both of the nozzles 43 and 44. It should be understood that this routine can be used regardless of whether one or two components are picked up.

When the program starts, it moves to the step S-21 wherein the axis driver controller 85 actuates both Z axis servo motors 45 and 46 of the pick-up nozzles 43 and 44 so as to elevate these pick-up nozzles. The program then moves to the step S-22 to determine that the pick-up nozzles are raised to a position where they will be free of interference with the photo assist unit 59. It should be noted that prior to this operation, the photo assist device 59 could have been in the position of FIGS. 4 and 5 at the completion of the previous routine of FIG. 11. If the nozzles 43 and 44 are not free of the photo assist unit 59, the program repeats. Again, this can be determined either by the output of the Z axis position detectors 47 and 48 or by means of a separate interference detector.

If at the step S-22 it is determined that the nozzles 43 and 44 are free of interference with the photo assist device, then at the step S-23 the cylinder 65 is actuated to move the device to the second position as shown in FIGS. 6 and 7. It is determined then at the step S-24 whether the photo assist device 59 is clear. If it is not, the program repeats.

If it is determined at the step S-24 that the photo assist device 59 is in its second position, then the program moves the step S-25 so as to attract the component or components by lowering the respective pick-up nozzles 43 and/or 44 when they are appropriately positioned over the respective tape feeder 25 or 26.

The components then picked up are recognized simultaneously within the detecting section 54 at the step S-26 in the manner described in co-pending application Ser. No. 86,512. This also determines the corrective factor of the X and Y axes and the rotational corrective factor around the R axis. The components are then mounted at the step S-27.

The final control routine of the mounting head 28 will now be described by reference to FIG. 13 and this is the control routine when the mounting head 28 and specifically the substrate or circuit board camera 76 is employed.

The program starts and moves to the step S-31 so as to move the mounting head 28 to an area above the conveyor 24 and specifically a substrate 27 positioned thereon in a location where the recognition mark of the substrate is positioned. Again, this is done by operating the X and Y axis servo motors 35 and 39.

The program then moves to the step S-32 so as to raise both pick-up nozzles 43 and 44 to a position where they are free of interference with the photo assist unit 59, this being the position shown in FIGS. 8 and 9. When the elevation is started, the program moves to the step S-33 to determine if the photo assist unit 59 is free of interference with the nozzles 43 and 44. If they are not, the program repeats. Again, this can be done either by the outputs from the Z axis position detectors 47 and 48 or by a separate interference detector.

The program then moves to the step S-34 so as to move the photo assist 59 to the position shown in FIG. 8 by actuating only the cylinder 73. The program then moves to the step S-35 to insure that this movement is completed. If it is not, the program repeats.

If, however, at the step S-35 it is determined that the photo assist device is in the position shown in FIG. 8, then the program moves to the step S-36 so as to turn on the LED's 61 and at the step S-37 to photograph the substrate or circuit board by actuating the camera 76.

The image thus produced is then compared at the step S-38 in the image processing section 83 with those memorized and the main processor 84 then determines the recognition of the substrate and the program ends.

Figure 13:
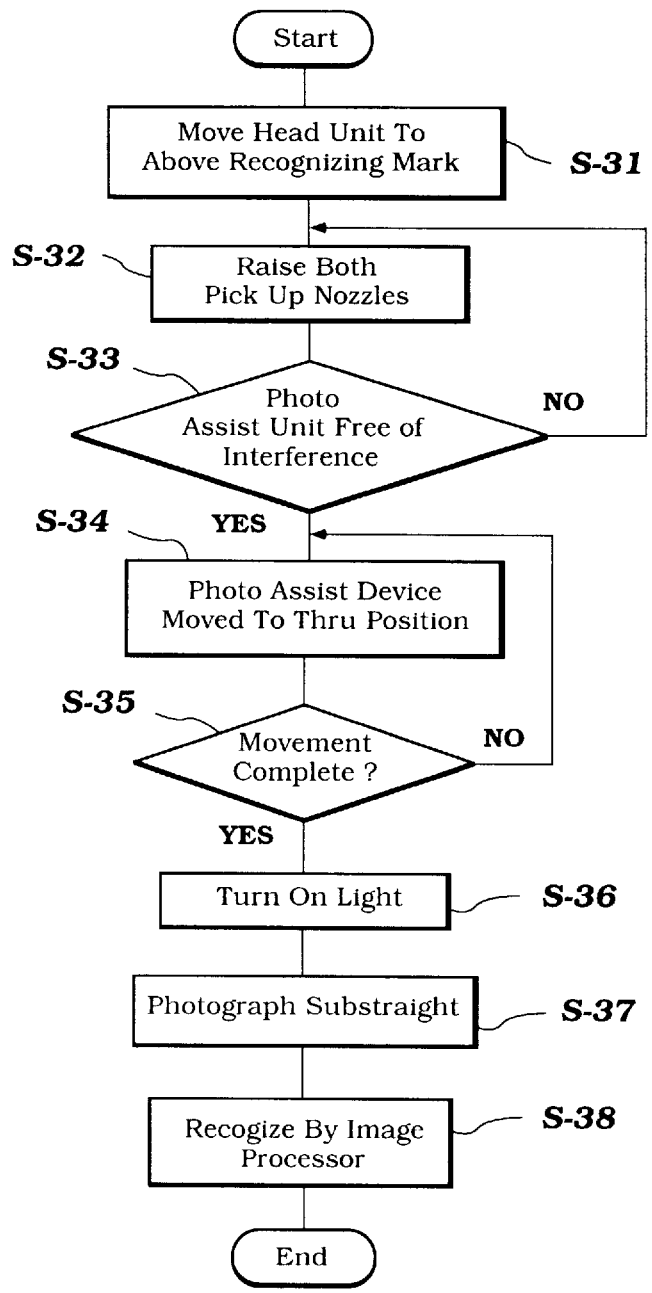
FIG. 13 is a block diagram showing the routine when the substrate is being recognized photographically.

In the described series of operations of FIGS. 11 through 13, a certain sequence of operation has been assumed. It is to be understood that certain steps in the sequence may be interposed with each other. For example, the led unit may be turned on at another time. Also, these steps or some of them may take place when the head 28 is actually being moved, again depending upon the control routine followed.

It should be readily apparent from the foregoing description that the described apparatus is capable of performing and satisfying the objects as aforenoted in extremely simple and yet highly effective manner. Of course, the foregoing description is that only of preferred embodiments of the invention and various changes and modifications may be made without departing from the spirit and scope of the invention, as defined by the appended claims.

I claim:

1. A component handling device for providing photographic recognition of a component comprised of a head supported for movement in X and Y directions, a pick-up device carried by said head for picking up a component, a combined light source and diffuser plate for emitting and diffusing light toward a camera carried by said head, said combined light source and diffuser plate having an opening extending therethrough for passing light to a lens of said camera, means for supporting said combined light source and diffuser plate for relative movement to said head between a first operative position in confronting relationship to said camera, a retracted position and a second operative position, and another camera cooperative with said combined light source and diffuser plate when in said second operative position, said head being moveable relative to said other camera, said other camera cooperating with an article carried by said pick-up device.

2. A component handling device for providing photographic recognition of a component as set forth in claim 1 wherein the pick-up device extends through the hole in the combined light source and diffuser plate when cooperating with the other camera.

3. A component handling device for providing photographic recognition of a component as set forth in claim 2 wherein there are two pick-up devices supported by the head.

4. A component handling device for providing photographic recognition of a component as set forth in claim 3 wherein the combined light source and diffuser plate cooperates with only one of the pick-up devices.

5. A component handling device for providing photographic recognition of a component as set forth in claim 4 further including a sensor carried by the head for sensing components carried by the two pick-up devices.

6. A component handling device for providing photographic recognition of a component comprised of a camera, a head supported for movement in X and Y directions relative to said camera, a pick-up device carried by said head and adapted to pick up a component to be photographed by said camera, and means for supporting said combined light source and diffuser plate by said head and for relative movement to said head between an operative position in confronting relationship to said camera and a retracted position that does not confront said camera.

7. A component handling device for providing photographic recognition of a component as set forth in claim 6 wherein the combined light source and diffuser plate has an aperture therein for passing the pick-up device.

8. A component handling device for providing photographic recognition of a component as set forth in claim 7 further including a sensor carried by the head for sensing a component carried by the pick-up device.

9. A component handling device for providing photographic recognition of a component as set forth in claim 8 wherein there are two pick-up devices carried by the head.

10. A component handling device for providing photographic recognition of a component as set forth in claim 9 wherein the sensor cooperates with both of the pick-up devices to sense simultaneously components carried thereby.

* * * * *